(12) United States Patent
Yagishita

(10) Patent No.: US 6,377,509 B2
(45) Date of Patent: Apr. 23, 2002

(54) SEMICONDUCTOR INTEGRATED CIRCUIT

(75) Inventor: Yoshimasa Yagishita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/739,972

(22) Filed: Dec. 20, 2000

(30) Foreign Application Priority Data

Jan. 19, 2000 (JP) ........................................ 2000-009693

(51) Int. Cl.$^7$ ................................................. G11C 7/00
(52) U.S. Cl. ........................... 365/230.06; 365/230.01; 365/189.01; 365/233; 365/230.03
(58) Field of Search ........................ 365/189.01, 230.01, 365/230.03, 230.06, 233

(56) References Cited

U.S. PATENT DOCUMENTS 6,026,043 A * 2/2000 Suzuki ........................ 365/222
6,240,045 B1 * 5/2001 Haraguchi et al. .......... 365/233
6,307,779 B1 * 10/2001 Roohparrar ............. 365/185.11
2001/0008280 A1 * 7/2001 Yagishita ....................... 257/1

* cited by examiner

Primary Examiner—Viet Q. Nguyen
(74) Attorney, Agent, or Firm—Arent Fox Kintner Plotkin & Kahn, PLLC

(57) ABSTRACT

The command decoder decodes a command signal to generate a command control signal. The mask circuit receives the command control signal to recognize the operating state of the memory core thereafter, and activates a mask signal when the command signal to be supplied anew is unacceptable. The control circuit disables an operation of the memory core corresponding to the command control signal when the mask signal is activated. Illegal commands are decided by the mask circuit alone. On this account, the control circuit need not be provided with a circuit for individually determining commands as illegal in accordance with actual operating states. Therefore, using the mask circuit makes it possible to prevent malfunctions resulting from illegal commands with facility and reliability. The intrinsic functions of the control circuit have only to be verified at the time of design and circuit modifications, which results in improving design efficiency.

5 Claims, 12 Drawing Sheets ns SEMICONDUCTOR INTEGRATED CIRCUIT

BACKGROUND OF THE INVENTION

1. Field of the Invention

The present invention relates to a semiconductor integrated circuit comprising a memory core having memory cells, and more particularly to a semiconductor integrated circuit which operates its memory core in accordance with commands supplied from exterior.

The present invention also relates to a semiconductor integrated circuit comprising a plurality of banks each having a memory core and a control circuit thereof.

Moreover, the present invention relates to a semiconductor integrated circuit which operates its memory core in synchronization with a clock signal.

2. Description of the Related Art

Owing to the development of semiconductor manufacturing technologies, semiconductor integrated circuits have been increasing its operation speed. Microcomputers and the like have improved in operating frequency year by year, with a growing disparity from the operating frequencies of DRAMs and other semiconductor memories. To narrow this disparity, there have been developed high-speed memories including SDRAMs (Synchronous DRAMs) and FCRAMs (Fast Cycle RAMs). Such memories as an SDRAM perform read operations, write operations, refresh operations, or the like depending on commands supplied from exterior.

FIG. 1 shows an example of the major part of a conventional SDRAM.

The SDRAM has an input buffer 1 for receiving a command signal CMD from exterior, a command decoder 2 for decoding the command signal CMD to generate a command control signal CMDCON, and banks BK0, BK1, BK2, and BK3 each including a control circuit 3 and a memory core 4. The memory core 4 has a plurality of not-shown memory cells, word decoders, sense amplifiers, precharging circuits, and the like.

The control circuit 3 receives a plurality of command signals CMDCON from the command decoder 2, and outputs a plurality of timing signals TIM for controlling the memory core 4 in accordance with these control signals CMDCON. The control circuit 3 has timing signal generators 3a each of which generates a timing signal TIM, decision circuits 3b for controlling the operations of predetermined timing generators 3a in accordance with the operating state of the memory core 4, and internal control circuits 3c for controlling timing signal generators 3a and decision circuits 3b. Each of the decision circuits 3b has the function of disabling the acceptance of a new command control signal CMDCON during the operations of the timing signal generators 3a which are controlled by themselves. Here, the commands to be acceptance-disabled are generally referred to as illegal commands. For example, a decision circuit 3b that controls a timing signal generator 3a associated with a read operation disables the acceptance of read commands while this timing signal generator 3a is in operation. In this case, illegal commands are the read commands supplied during the read operation.

The description as to which command is considered as an illegal command in what operating state is given in SDRAM data sheets or the like. Therefore, illegal commands will not be supplied to the SDRAM in normal operations. To avoid malfunctions due to accidental supply of illegal commands, the decision circuits 3b control the timing signal generators 3a.

In the control circuits 3 described above, the decision circuits 3b are respectively formed for each of the timing signal generators 3a, and these decision circuits 3b individually determining illegal commands based on the actual operations of the timing signal generators 3a so that malfunctions are prevented. The control circuits 3 have many timing signal generators 3a aside from those shown in the diagram, and there are a number of combinations of operating states for illegal commands. Accordingly, it is not easy to form the decision circuits 3b with consideration taken into all the combinations. In addition, forming a number of decision circuits 3b contributes to an increase in chip size.

Besides, as in the SDRAM shown in FIG. 1, it is more complicated to determine illegal commands in SDRAMs having a plurality of banks. For example, a read command supplied to the same bank during a read operation is considered as an illegal command, yet as a normal command (legal command) to other banks. Accordingly, the control circuits 3 are conventionally formed in the individual banks BK0-BK3 so as to individually determine illegal commands.

Furthermore, in case command specifications are modified or a new function is added at the time of development of new products, it is required to consider the combinations of operating states for illegal commands. This consequently increases design man-hours because the conventional control circuits 3 can not be simply utilized.

SUMMARY OF THE INVENTION

An object of the present invention is to provide a semiconductor integrated circuit capable of determining commands as illegal with facility and reliability.

According to one of the aspects of the semiconductor integrated circuit in the present invention, the semiconductor integrated circuit has a memory core having a plurality of memory cells, a command decoder, a mask circuit, and a control circuit. The command decoder decodes a command signal to generate a command control signal. The mask circuit receives the command control signal to recognize the operating state of the memory core thereafter, and activates a mask signal when the command signal to be supplied anew is unacceptable. That is, the mask circuit recognizes the operations of the control circuit and memory core not from the operating state of the control circuit but from the supplied command signal. The control circuit disables an operation of the memory core corresponding to the command control signal when the mask signal is activated.

Illegal commands are decided by the mask circuit alone. On this account, the control circuit need not be provided with a circuit for individually determining commands as illegal in accordance with actual operating states. Therefore, using the mask circuit makes it possible to prevent malfunctions resulting from illegal commands with facility and reliability. The intrinsic functions of the control circuit have only to be verified at the time of design and circuit modifications, which results in improving design efficiency.

According to another aspect of the semiconductor integrated circuit in the present invention, the control circuit has an input circuit. The input circuit receives the command control signal and the mask signal and disables the acceptance of the command control signal when the mask signal is activated. That is, the input circuit discriminates between acceptable commands and unacceptable commands. Accordingly, illegal commands can be controlled at the entrance of the control circuit, allowing simpler configuration of the control circuit.

According to another aspect of the semiconductor integrated circuit in the present invention, the control circuit and the memory core individually operate in synchronization with a clock signal. The mask circuit activates the mask signal based on the number of clocks in the clock signal. Therefore, the mask signal is generated at precise timing particularly in the semiconductor integrated circuit of clock synchronous type.

According to another aspect of the semiconductor integrated circuit in the present invention, the semiconductor integrated circuit comprises a plurality of banks each having the memory core and the control circuit. Each mask circuit receives the command control signal and a bank selecting signal to individually recognize the operating state of the memory core in each of the banks thereafter. Then, the mask circuit activates the mask signal corresponding to the control circuit in a predetermined bank when a command signal to be supplied anew to the bank is unacceptable.

Therefore, even in the semiconductor integrated circuit having a plurality of banks, circuits for individually determining commands as illegal in accordance with the actual operating states need not be formed in the control circuit in each of the banks. Using the mask circuit prevents malfunctions resulting from illegal commands with facility and reliability.

According to another aspect of the semiconductor integrated circuit in the present invention, the semiconductor integrated circuit has an interleaving function of performing a read operation or a write operation in sequence on a plurality of the banks with consecutive addresses when a burst length, or the number of times the read operation or the write operation is performed in succession, is greater than a predetermined value. Even in the semiconductor integrated circuit having the interleaving function, malfunctions due to the illegal commands can be prevented with facility and reliability by deciding illegal commands by the mask circuit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the embodiments of the present invention will be described with reference to the drawings.

Figure 1:
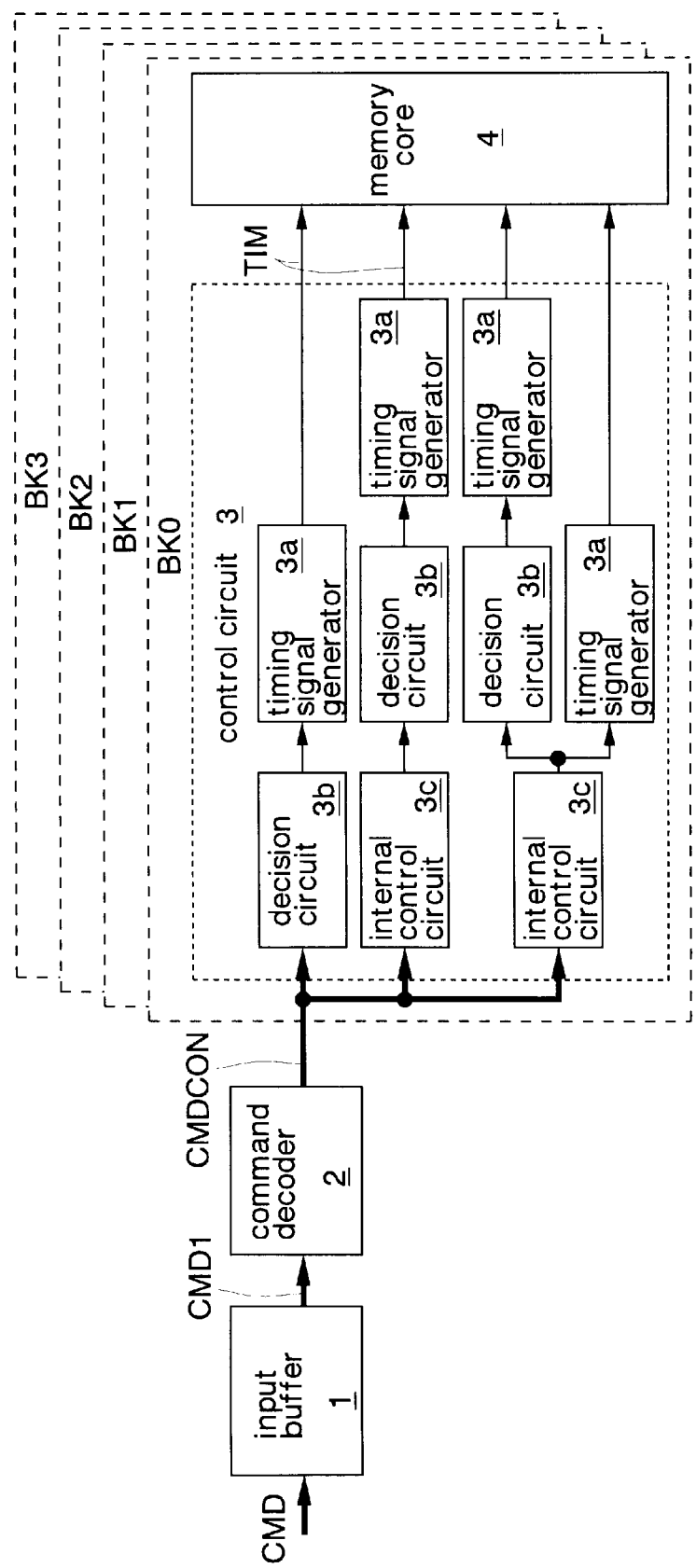
FIG. 1 is a block diagram showing a conventional SDRAM.
Figure 2:
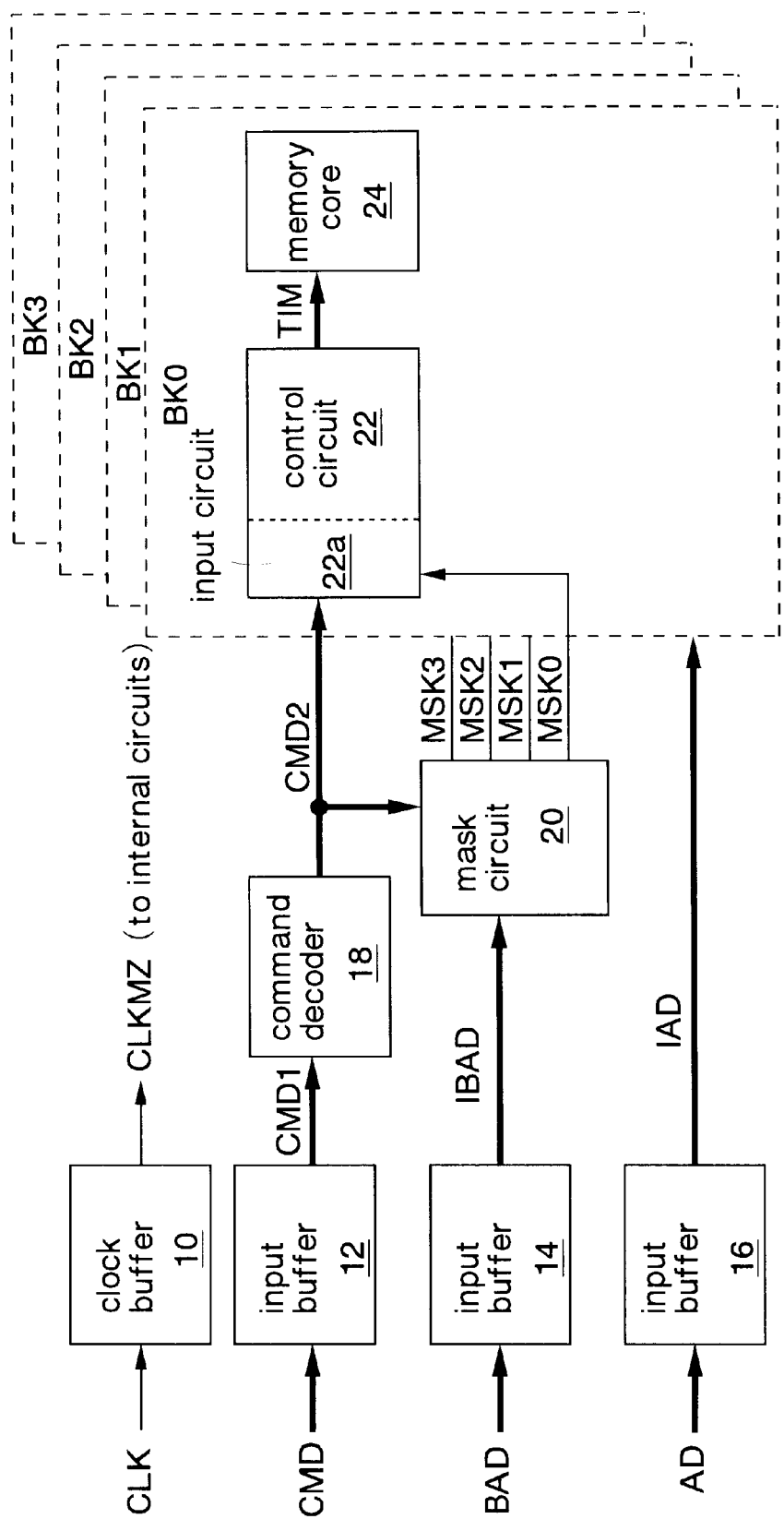
FIG. 2 is a block diagram showing a first embodiment.

FIG. 2 shows a first embodiment of the semiconductor integrated circuit in the present invention. In the drawings, thick lines represent signal lines consisting of a plurality of lines. Some of the blocks connected with the thick lines are composed of a plurality of circuits. In the following description, signal names will sometimes be abbreviated like "clock signal CLK" as "CLK signal".

The semiconductor integrated circuit in this embodiment is formed on a silicon substrate by using CMOS processes, as an SDRAM.

This SDRAM has a clock buffer 10, input buffers 12, 14, and 16, a command decoder 18, a mask circuit 20, and banks BK0, BK1, BK2, and BK3 each having a control circuit 22 and a memory core 24. The memory core 24 has a plurality of not-shown memory cells, word decoders, sense amplifiers, precharging circuits, and the like. Incidentally, circuits for handling data signals are omitted from FIG. 2.

The clock buffer 10 receives a clock signal CLK from exterior, and outputs the received clock signal CLK to internal circuits in SDRAM as an internal clock signal CLKMZ. The input buffer 12 receives a command signal CMD from exterior, and outputs the received signal as an internal command signal CMD1. The input buffer 14 receives from exterior a bank address signal BAD for selecting a bank BK0-BK3, and outputs the received signal as an internal bank address signal IBAD. For example, the bank address signal BAD consists of two bits. The input buffer 16 receives an address signal AD from exterior, and outputs the received signal as an internal address signal IAD. The command decoder 18 receives the CMD1 signal, decodes the received signal, and outputs a command control signal CMD2 corresponding to the decoded result. The command control signal CMD2 is supplied to all the banks BK0-BK3.

The mask circuit 20 receives the CMD2 signal and the IBAD signal, and outputs mask signals MSK0, MSK1, MSK2, and MSK3 to the banks BK0-BK3, respectively. The mask circuit 20 has the function of receiving the CMD2 signal and the IBAD signal, recognizing the operating states of the individual banks BK0-BK3 thereafter, and activating the mask signals MSK0-MSK3 when the CMD2 and IBAD signals supplied anew are unacceptable.

The control circuits 22 receive the CMD2 signal and the MSKn signals (n:bank number) at their input circuits 22a, generate a plurality of timing signals TIM corresponding to the CMD2 signal, and output the signals TIM to the memory cores 24. The input circuits 22a receive the activation of the MSKn signals to disable the acceptance of the CMD2 signal. That is, the input circuits 22a discriminates between acceptable and unacceptable commands to the control circuits 22, in accordance with the operating states of the respective banks BK0-BK3. On this account, the control circuits 22 does not require conventional decision circuits for making decisions as to illegal commands. Accordingly, the control circuits 22 can be composed of circuits necessary only for the operation of the memory cores 24, which facilitates its designing. The timing signals TIM output from the control circuits 22 include a word line control signal, a column line control signal, an address decoder control signal, a sense amplifier control signal, and a precharge control signal.

The memory cores 24 receive the timing signals TIM, and perform a read operation, a write operation, or a refresh operation depending on the CMD signal supplied.

Figure 3:
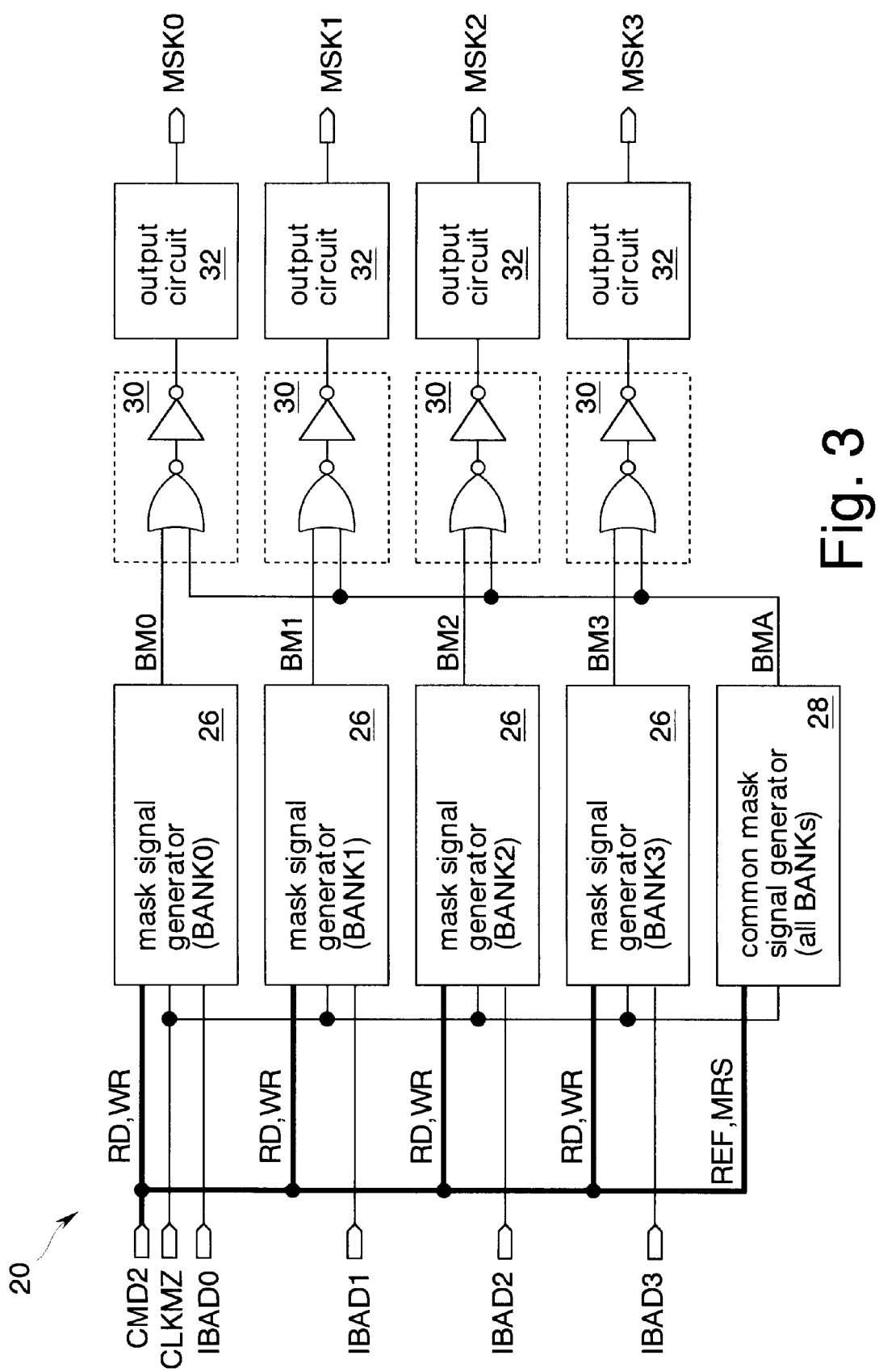
FIG. 3 is a block diagram showing the details of a mask circuit in FIG. 2.

FIG. 3 shows the details of the mask circuit 20.

The mask circuit 20 has mask signal generators 26 corresponding to the individual banks BK0-BK3, a common mask signal generator 28 corresponding to all the banks BK0-BK3, four OR circuits 30, and four output circuits 32.

The mask signal generators 26 receive the CLKMZ signal, the CMD2 signal (a read command signal RD, a write command signal WR), and the IBADn signals (n:bank number), and output mask signals BMn. The common mask signal generator 28 receives the CLKMZ signal and the CMD2 signal (a refresh command REF, a mode register setting command signal MRS), and outputs a mask signal BMA.

The OR circuits 30 output the logical ORs of the BMn signals and the mask signal BMA to the output circuits 32, respectively. The output circuits 32 output the received signals as the mask signals MSKn (n:bank number), respectively. The MSKn signals are activated (turned to high level) at the time of disabling the operations of the individual banks BK0-BK3.

Figure 4:
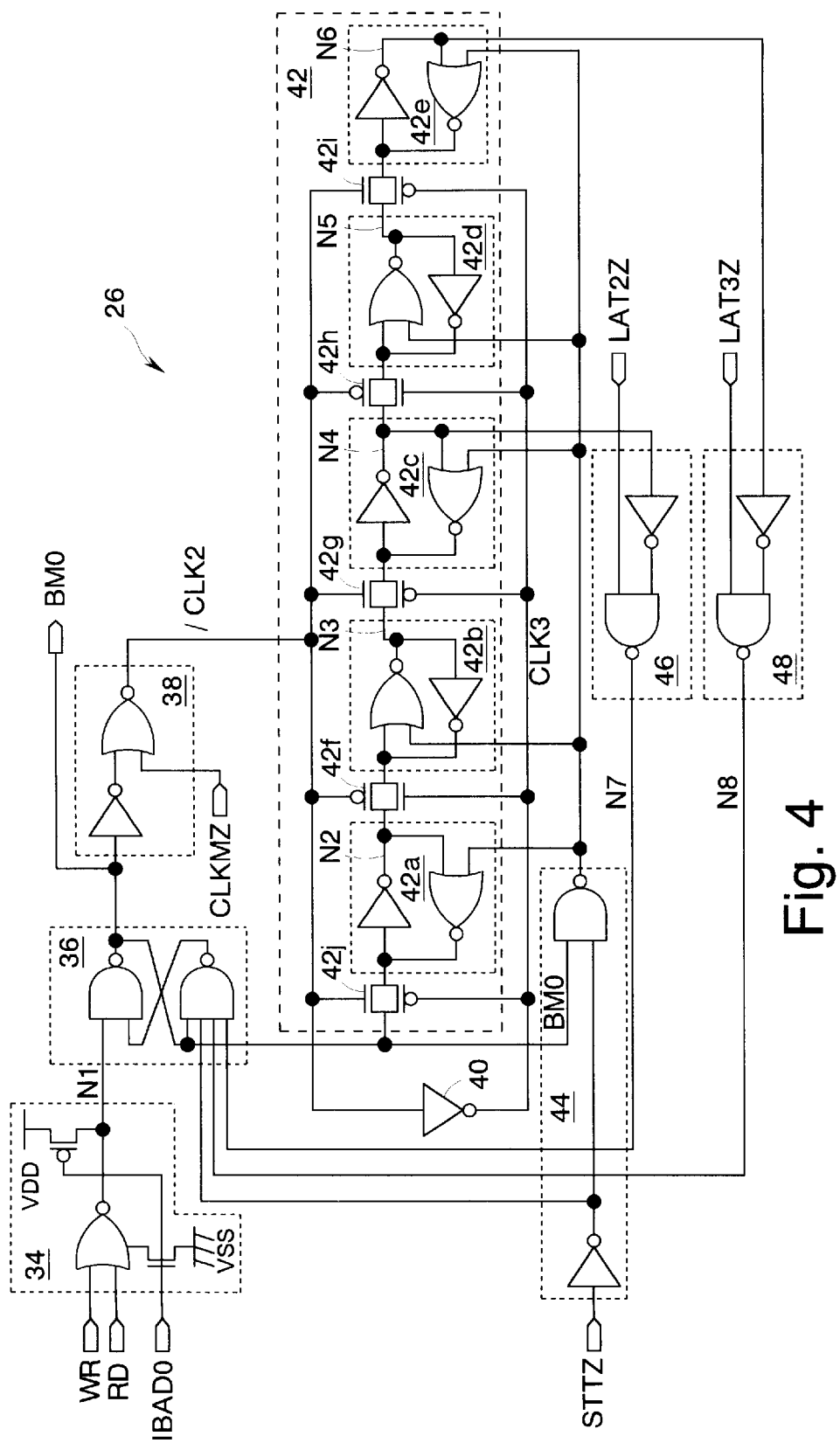
FIG. 4 is a circuit diagram showing the details of a mask signal generator in FIG. 3.

FIG. 4 shows the details of the mask signal generators 26. Here, explanations will be given of the mask signal generator 26 corresponding to the bank BK0.

The mask signal generator 26 has an input circuit 34, a flip-flop 36, a control gate 38, an inverter 40, a mask timing generator 42, and control gates 44, 46, and 48.

The input circuit 34 transmits the WR command signal or the RD command signal to a node N1 when the IBAD0 signal is at high level (when the bank BK0 is selected). The flip-flop 36 receives the level at the node N1 at one of its NAND gates, and receives the inverted signal of a power-on reset signal STTZ and the levels at nodes N7 and N8 at the other NAND gate. The power-on reset signal STTZ is set at high level for a predetermined period after the application of power supply and then turned to low level. The flip-flop 36 receives the high level of the STTZ signal and the low levels at the nodes N7 and N8 to inactivate (turn to low level) the BM0 signal. The flip-flop 36 receives the low level at the node N1 to activate (turn to high level) the BM0 signal.

The control gate 38 inverts the CLKMZ signal to generate a clock signal /CLK2 when the BM0 signal is activated. The inverter 40 inverts the /CLK2 signal to generate a clock signal CLK3.

The mask timing generator 42 has latch circuits 42a, 42b, 42c, 42d, and 42e connected in series via CMOS transmission gates 42f, 42g, 42h, and 42i. The input of the latch circuit 42a is connected to the CMOS transmission gate 42j. The latch circuits 42a, 42b, 42c, 42d, and 42e each consist of an inverter and a NOR gate connected to each other at their inputs and outputs. The latch circuits 42a, 42b, 42c, 42d, and 42e have output nodes N2, N3, N4, N5, and N6 which are reset to high level, low level, high level, low level, and high level, respectively, when the STTZ is at high level and when the BM0 signal is at low level. The CMOS transmission gates 42j, 42g, and 42i are turned on when the /CLK2 signal is at high level, and the CMOS transmission gates 42f and 42h are turned on when the /CLK2 signal is at low level. The mask timing circuit 42 functions as a shift register synchronizing with the /CLK2 signal.

The control gate 44 outputs a high level when the STTZ signal is at high level or when the BM0 signal is at low level. The control gate 46 transmits the level at the node N4 to the node N7 when a latency signal LAT2Z is activated (high level). The control gate 48 transmits the level at the node N6 to the node N8 when a latency signal LAT3Z is activated (high level). The latency signals LAT2Z and LAT3Z are signals corresponding to the number of clocks from the acceptance of a read command to the output of read data or the number of clocks from the acceptance of a write command to the input of write data.

Figure 5:
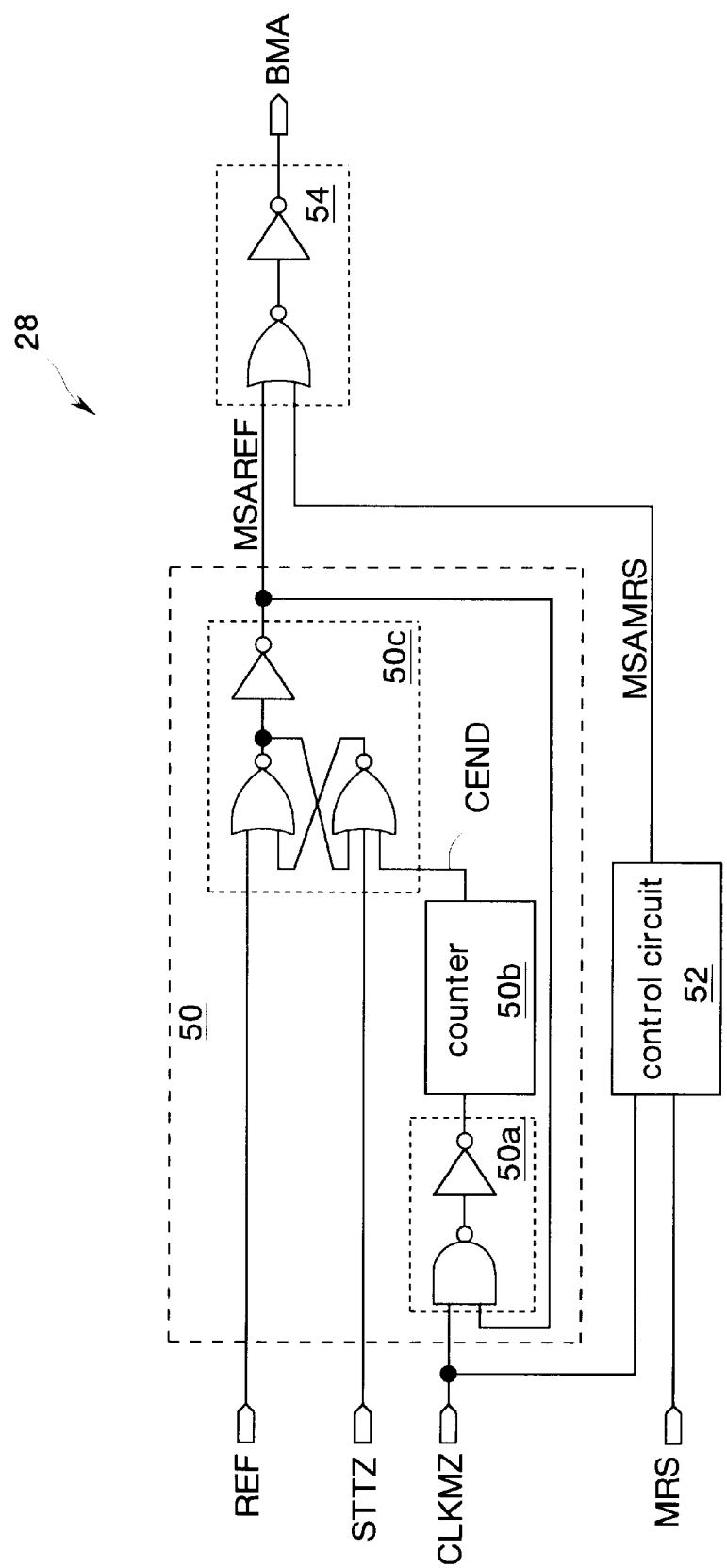
FIG. 5 is a circuit diagram showing the details of a common mask signal generator in FIG. 3.

FIG. 5 shows the details of the common mask signal generator 28.

The common mask signal generator 28 has a control circuit 50 for the refresh command REF, a control circuit 52 for the mode register setting command MRS, and an OR circuit 54. The control circuit 50 has an AND gate 50a, a counter 50b, and a flip-flop 50c. The AND gate 50a transmits the CLKMZ signal to the counter 50b when a mask signal MSAREF fed back from the flip-flop 50c is at high level. The counter 50b activates (turning to high level) a count end signal CEND after a predetermined count of the CLKMZ signal. The flip-flop 50c receives the refresh command signal REF at one of its NOR gates, and receives the STTZ signal and the CEND signal at the other NOR gate. The flip-flop 50c receives the high level of the STTZ signal or the high level of the CEND signal to inactivate (turn to low level) the MSAREF signal, and receives the high level of the REF command signal to activate (turn to high level) the MSAREF signal.

The control circuit 52 receives the MRS command signal and then sets a mask signal MSAMRS at high level while the CLKMZ signal is counted up to the predetermined number. The OR circuit 54 outputs the high-level MSAREF signal and the high-level MSAMRS signal as the mask signal BMA.

Figure 6:
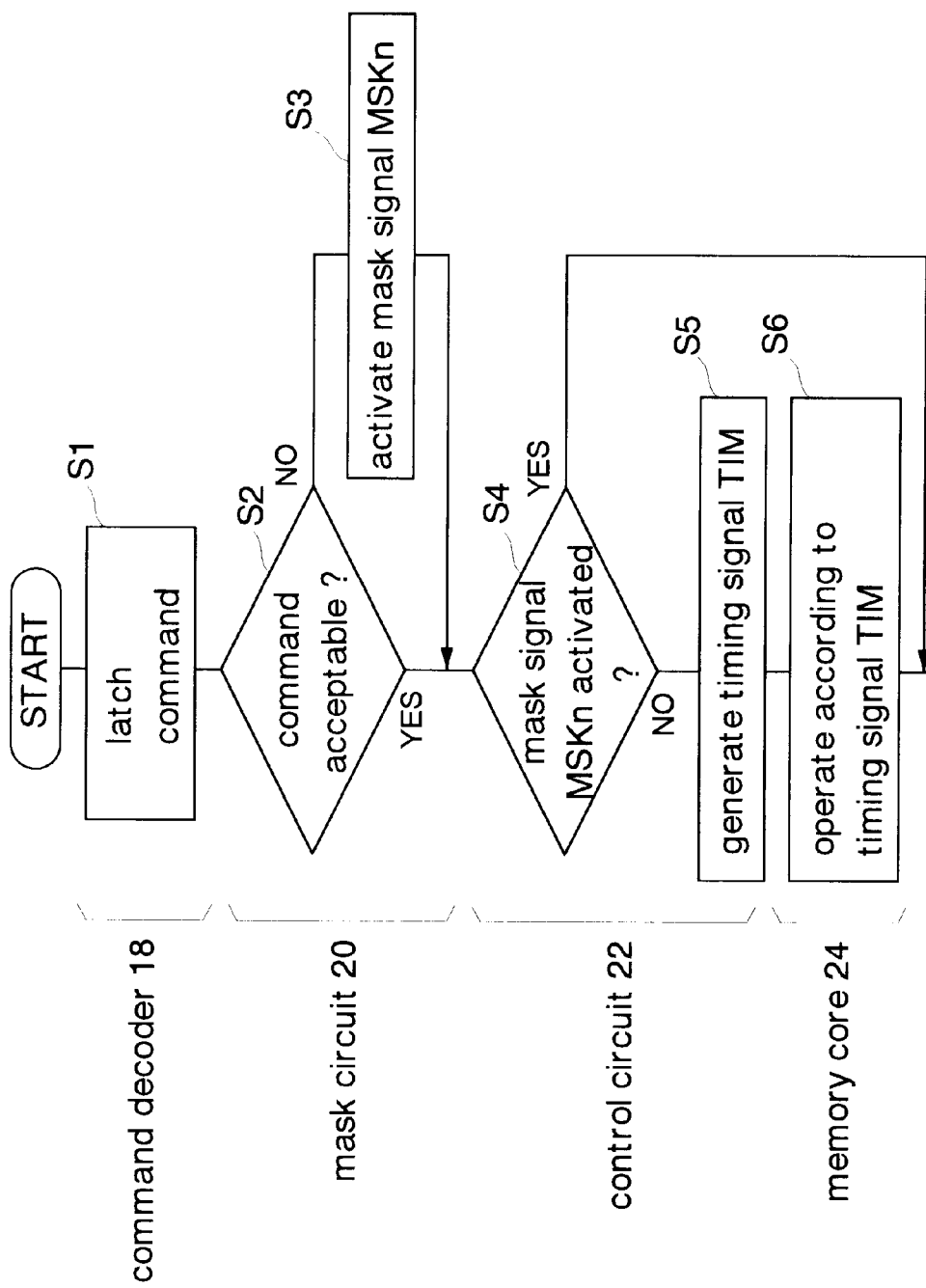
FIG. 6 is a flowchart showing an overview of the SDRAM control flow in the first embodiment.

FIG. 6 shows an overview of the SDRAM control flow in the present embodiment.

Initially, at step S1, the command decoder 18 shown in FIG. 2 latches a command from exterior.

Next, at step S2, the mask circuit 20 determines whether or not the latched command is acceptable. If acceptable, the control proceeds to step S4. If unacceptable, the control proceeds to step S3.

At step S3, the mask circuit 20 activates a mask signal MSKn (n:bank number). Then, the control proceeds to step S4.

At step S4, the control circuit 22 in each of the banks BK0-BK3 determines whether or not the MSKn signal is activated. If the MSKn signal is activated, the control ends. In other words, the command supplied to the SDRAM is invalidated. If the MSKn signal is not activated, the control proceeds to step S5.

At step S5, the control circuit 22 output a timing signal TIM to the memory core 24.

Next, at step S6, the control circuit 24 operates in accordance with the timing signal TIM. Then, the control ends.

As seen from above, the control circuits 22 make no decision about illegal commands.

Figure 7:
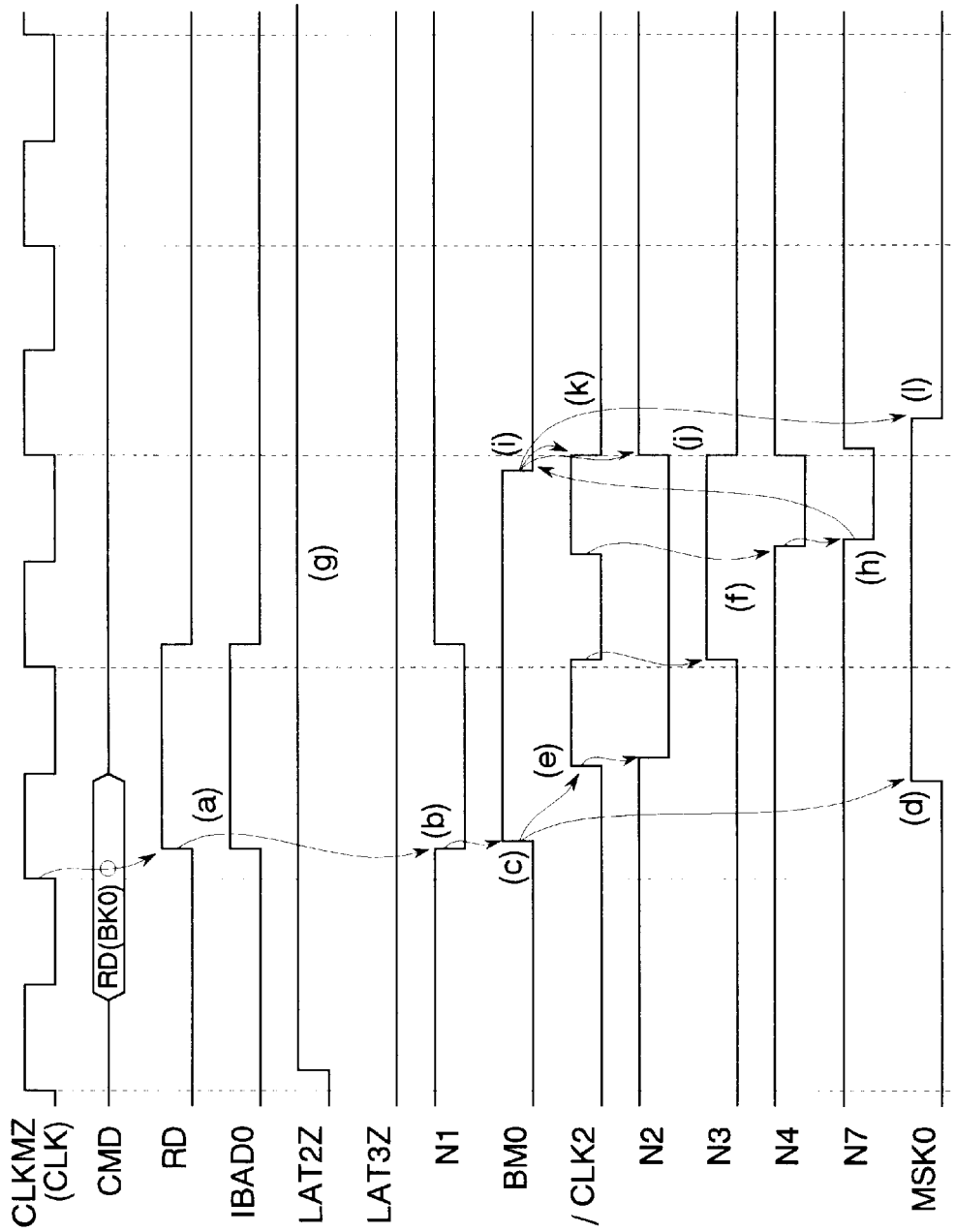
FIG. 7 is a timing chart showing the details of operation of the mask circuit in the first embodiment.

FIG. 7 shows the operation of the mask circuit 20 when an inoperative SDRAM performs a read operation to the bank BK0.

Initially, the SDRAM latches the CMD signal (read command RD) and the BAD signal (BK0) in synchronization with the CLK signal, and turns the RD signal and the IBAD0 signal to high level (FIG. 7, (a)).

The input circuit 34 shown in FIG. 4 transmits the inverted signal of the RD signal to the node N1 (FIG. 7, (b)). The flip-flop 36 is set in response to the low level at the node N1, turning the BM0 signal to high level (FIG. 7, (c)). Here, the mask signal generator 26 will not accept any new read command RD or write command WR corresponding to the bank BK0 until the BM0 signal is turned to low level. The OR circuit 30 and the output circuit 32 shown in FIG. 3 receive the high-level BM0 signal to turn the MSK0 signal to high level (FIG. 7, (d)).

The latch circuits 42a, 42b, 42c, 42d, and 42e receive the high level of the BM0 signal through the control gate 44, and release their reset states. The control gate 38 is activated in response to the high level of the BM0 signal, and outputs the /CLK2 signal (FIG. 7, (e)).

The /CLK2 signal and the CLK3 signal are supplied to the gates of the CMOS transmission gates 42j, 42f, 42g, 42h, and 42i in the mask timing generator 42. The mask timing generator 42 makes shift operations, thereby transmitting the BM0 signal (or the inverted signal thereof) to the nodes N2, N3, and N4 in succession (FIG. 7, (f)).

The LAT2Z signal and the LAT3Z signal are previously set at high level and low level, respectively, by mode register settings or the like (FIG. 7, (g)). The control gate 46 receives the high level of the LAT2Z signal and the low level at the node N4 to turn the node N7 to low level (FIG. 7, (h)). The flip-flop 36 is reset in response to the low level at the node N7, thereby turning the BM0 signal to low level (FIG. 7, (i)). The latch circuits 42a, 42b, 42c, 42d, and 42e receive the low level of the BM0 signal through the control gate 44 for reset (FIG. 7, (j)). In response to the low level of the BM0 signal, the control gate 38 is inactivated to stop outputting the /CLK2 signal (FIG. 7, (k)). The OR circuit 30 and the output circuit 32 receive the low-level BM0 signal to turn the MSK0 signal to low level (FIG. 7, (l)).

As described above, the mask circuit 20 sets the MSK0 signal at high level for a predetermined number of clocks after the acceptance of the read command RD. The input circuit 22a in the bank BK0 shown in FIG. 2 disables the acceptance of new CMD2 signals while receiving the MSK0 signal of high level. Meanwhile, the control circuit 22 performs a read operation in accordance with the read command RD accepted last.

Figure 8:
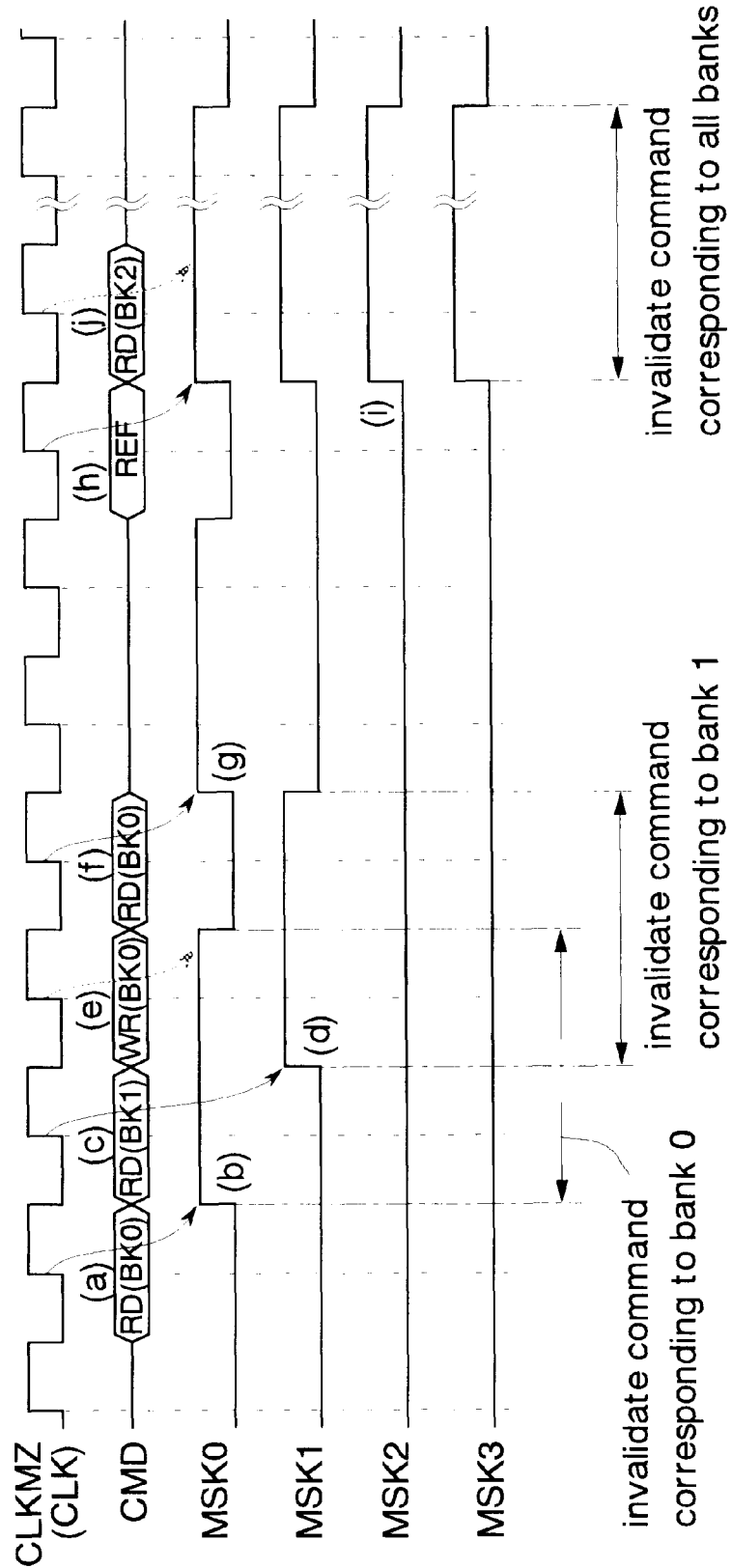
FIG. 8 is a timing chart showing the details of operation of the mask circuit in the first embodiment.

FIG. 8 shows the operation of the mask circuit 20 in the case where an inoperative SDRAM operates a plurality of banks.

Initially, the SDRAM latches the CMD signal (read command RD) and the BAD signal (BK0) in synchronization with a rise of the CLK signal (FIG. 8, (a)). The mask circuit 20 sets the MSK0 signal, corresponding to the bank BK0, at high level for a period of approximately two clocks (FIG. 8, (b)). During this period, any new command to the bank BK0 is invalidated.

The SDRAM latches the CMD signal (read command signal RD) and the BAD signal (BK1) in synchronization with the next rise of the CLK signal (FIG. 8, (c)). The mask circuit 20 sets the MSK1 signal, corresponding to the bank BK1, at high level for a period of approximately two clocks (FIG. 8, (d)). During this period, any new command to the bank BK1 is invalidated.

The SDRAM latches the CMD signal (write command signal WR) and the BAD signal (BK0) in synchronization with the next rise of the CLK signal (FIG. 8, (e)). Here, the mask circuit 20 has the MSK0 signal held at high level. Therefore, this write command signal WR is invalidated (an illegal command).

The SDRAM latches the CMD signal (read command signal RD) and the BAD signal (BK0) in synchronization with the next rise of the CLK signal (FIG. 8, (f)). Here, the MSK0 signal has been turned to low level. Again, the mask circuit 20 sets the MSK0 signal at high level for a period of approximately two clocks (FIG. 8, (g)).

Moreover, the SDRAM latches the CMD signal (refresh command signal REF) in synchronization with the next rise of the CLK signal (FIG. 8, (h)). The SDRAM in this embodiment also has the function of applying a refresh operation to all the banks at the same time. The common mask signal generator 28 shown in FIG. 5 activates (turns to high level) the mask signal BMA while the control circuit 50 counts a predetermined number of clocks. The predetermined number of clocks corresponds to the period required for a refresh operation. The mask circuit 20 receives the BMA signal, and activates all the MSK0-MSK3 signals (FIG. 8, (i)). Commands to any of the banks BK0-BK3 are invalidated while the MSK0-MSK3 signals are activated.

The SDRAM latches the CMD signal (read command signal RD) and the BAD signal (BK2) in synchronization with the next rise of the CLK signal (FIG. 8, (j)). This read command signal RD, however, is invalidated (an illegal command).

As has been described above, in the semiconductor integrated circuit of this embodiment, the mask circuit 20 receives the command control signal CMD2 to recognize the operating states of the memory cores 24 thereafter, and activates the mask signal MSKn when a newly supplied command control signal CMD2 is unacceptable. The control circuit 22, when its mask signal MSKn is activated, disable the operation of the memory cores 24 in accordance with the command control signal CMD2. Accordingly, illegal commands can be determined by the mask circuit 20 alone. Circuits for individually making decisions as to illegal commands based on the actual operating states need not be formed in the control circuits 22. Therefore, malfunctions resulting from illegal commands can be easily and reliably prevented by the mask circuit 20 alone. The intrinsic functions of the control circuits 22 have only to be verified at the time of design and circuit modifications, which allows an improvement in design efficiency.

The input circuits 22a formed in the control circuits 22 discriminate between acceptable commands and unacceptable commands. The illegal commands can be determined at the entrances of the control circuits 22 so that a decision circuit need not be formed corresponding to each circuit inside the control circuits 22. This allows simpler configuration of the control circuits 22.

The mask circuit 20 counts the clock signal CLK with its mask timing generator 42, and activates the mask signals MSKn based on the number of clocks. In the semiconductor integrated circuit of clock-synchronous type, the mask signals MSKn can be generated at precise timing.

The mask circuit 20 receives the command control signal CMD2 and the internal bank address signal IBAD, when a command signal CMD supplied to a predetermined bank BKn is unacceptable, individually activates the mask signal MSKn corresponding to the control circuits 22 in the bank BKn.

Therefore, even in the semiconductor integrated circuit having a plurality of banks BK0-BK3, the mask circuit 20 can determine commands as illegal for each of the banks BKn so that malfunctions resulting from illegal commands are prevented with facility and reliability.

Figure 9:
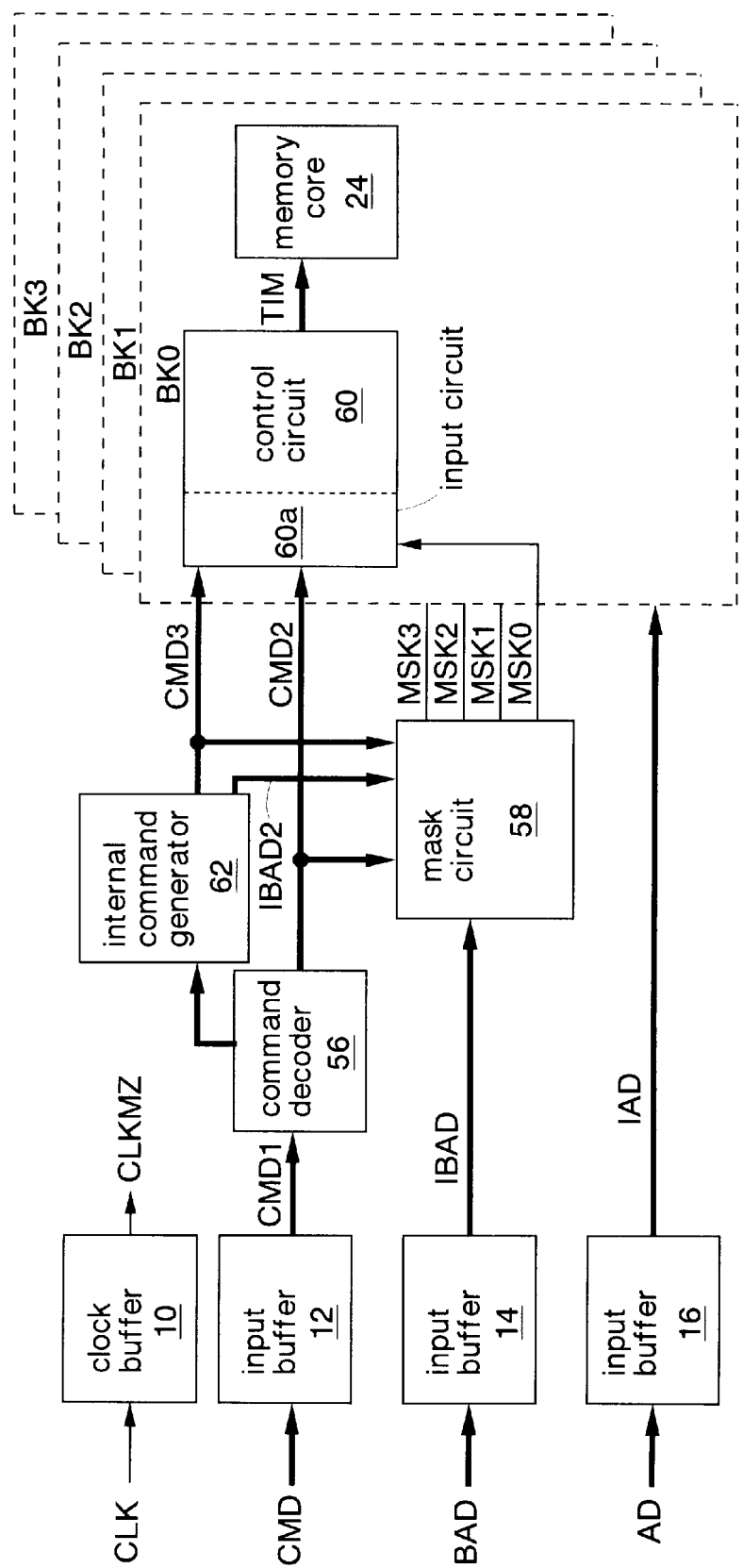
FIG. 9 is a block diagram showing a second embodiment.

FIG. 9 shows a second embodiment of the semiconductor integrated circuit in the present invention. The same circuits as those of the first embodiment will be designated by identical reference numbers. Detailed description of these circuits will be omitted here.

In this embodiment, a command decoder 56, a mask circuit 58, and control circuits 60 are different from those of the first embodiment. Additionally, an internal command generator 62 is formed. The other configuration is identical to that of the first embodiment. Circuits for handling data signals are omitted from FIG. 9. The SDRAM in this embodiment has an interleaving function of performing a read operation or a write operation in succession over a plurality of banks with consecutive addresses.

As in the first embodiment, the mask circuit 58 has mask signal generators 64 (to be described later) corresponding to the individual banks BK0-BK3, and a common mask signal generator 28 (not shown).

The internal command generator 62 receives a command control signal from the command decoder 56 when the burst length is "8", and generates a command control signal CMD3. The CMD3 signal is supplied to the input circuits 60a of the control circuits 60. The control circuits 60 generate TIM signals based on the CMD2 signal from the command decoder 56 and the CMD3 signal from the internal command generator 62.

Here, the burst length is the number of times a read operation or a write operation is executed in succession, and is set by using a mode register (not shown) or the like. In this embodiment, the burst length is set at "4" or "8".

The mask circuit 58 receives the CMD2 signal, the CMD3 signal, the IBAD signal, an IBAD2 signal, and outputs the MSK0-MSK3 signals.

Figure 10:
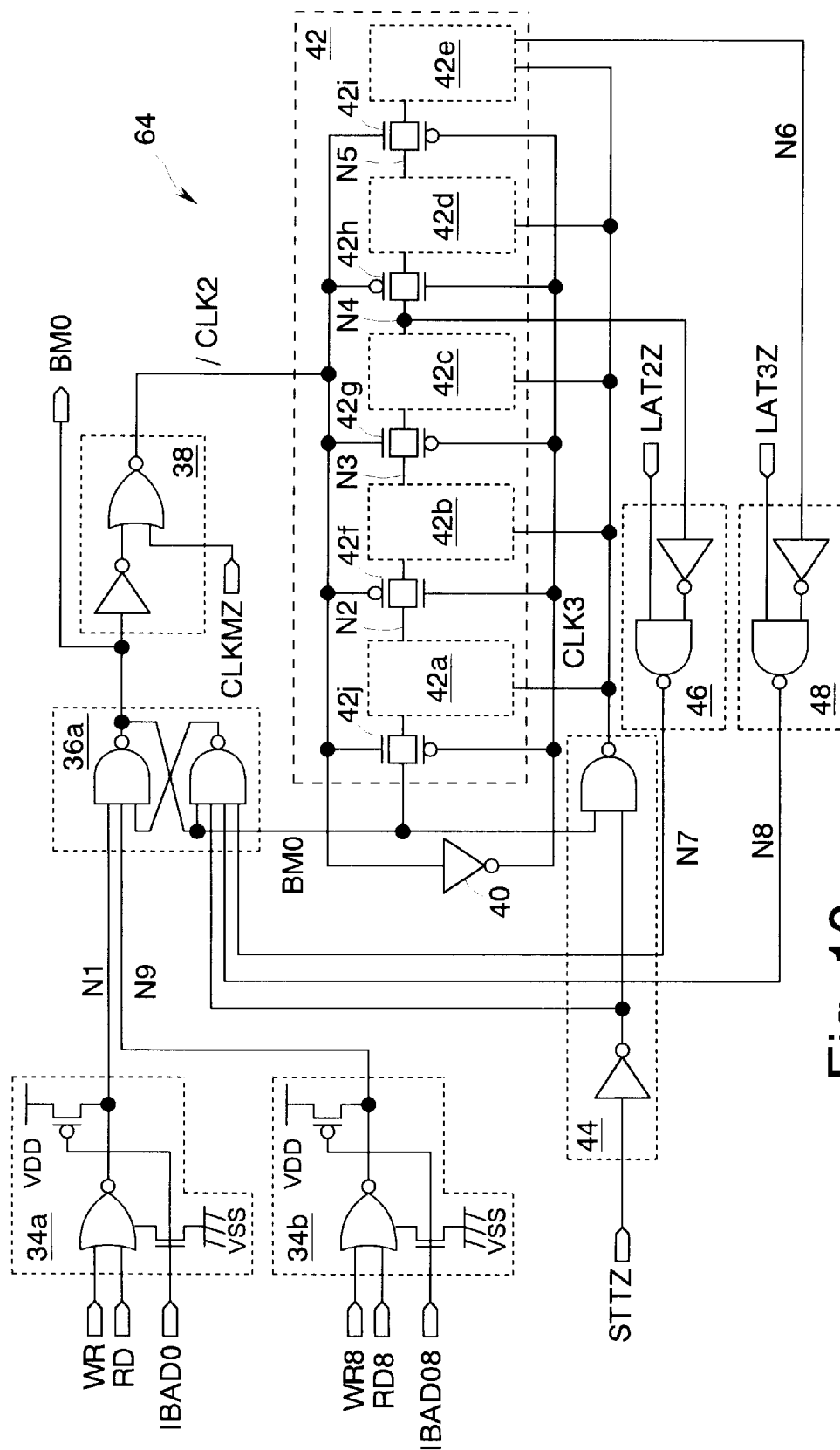
FIG. 10 is a circuit diagram showing the details of a mask signal generator in FIG. 9.

FIG. 10 shows the details of a mask signal generator 64 in the mask circuit 58.

The mask signal generator 64 has input circuits 34a and 34b which are identical to the input circuit 34 in the mask signal generator 26 (FIG. 4) of the first embodiment. The output nodes N1 and N9 of the input circuits are input to one of the NAND gates in the flip-flop 36a. The other configuration is the same as that of the mask signal generator 26 shown in FIG. 4.

The input circuit 34a is supplied with the same signals as those supplied to the input circuit shown in FIG. 4. The input circuit 34b transmits a write command signal WR8 or a read command signal RD8 to the node N9 when an internal bank address signal IBAD08 is at high level (when the bank BK0 is selected). The IBAD08 signal, the WR8 signal, and the RD8 signal are output from the internal command generator 62 when the burst length is set at "8".

Figure 11:
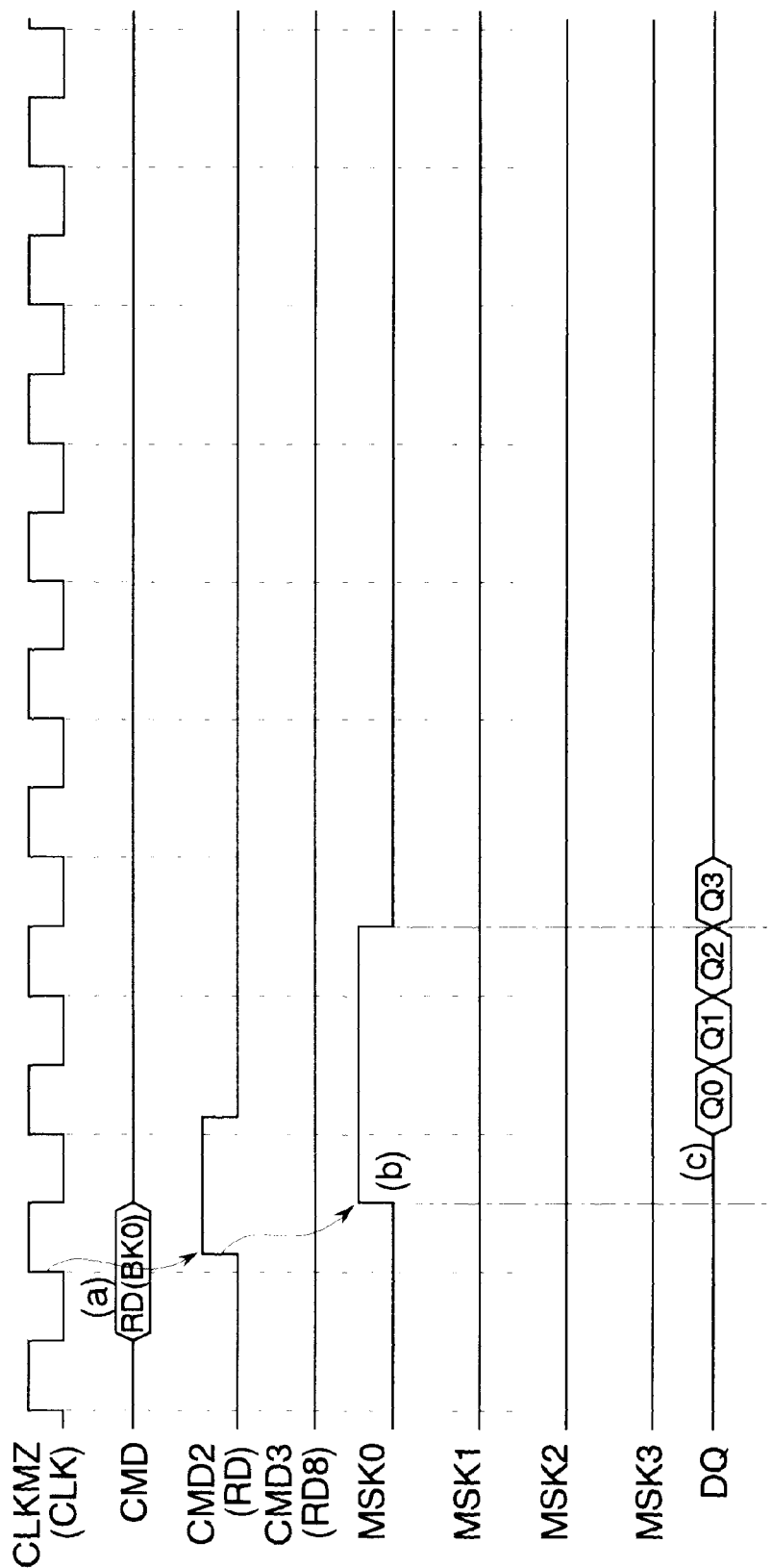
FIG. 11 is a timing chart showing the details of operation of the mask circuit in the second embodiment.

FIG. 11 shows a read operation of the SDRAM when the burst length is "4". The basic operations are the same as those of FIGS. 7 and 8 described above.

Initially, the SDRAM latches the CMD signal (read command RD) and the BAD signal (BK0) in synchronization with a rise of the CLK signal (FIG. 11, (a)). The mask circuit 58 sets the MSK0 signal, corresponding to the bank BK0, at high level for a period of approximately two clocks (FIG. 11, (b)). During this period, any new command to the bank BK0 is invalidated. Moreover, read data Q1, Q1, Q2, and Q3 corresponding to the burst length are sequentially output from a data input/output terminal DQ (not shown) in synchronization with the rising edges and falling edges of the CLK signal.

Figure 12:
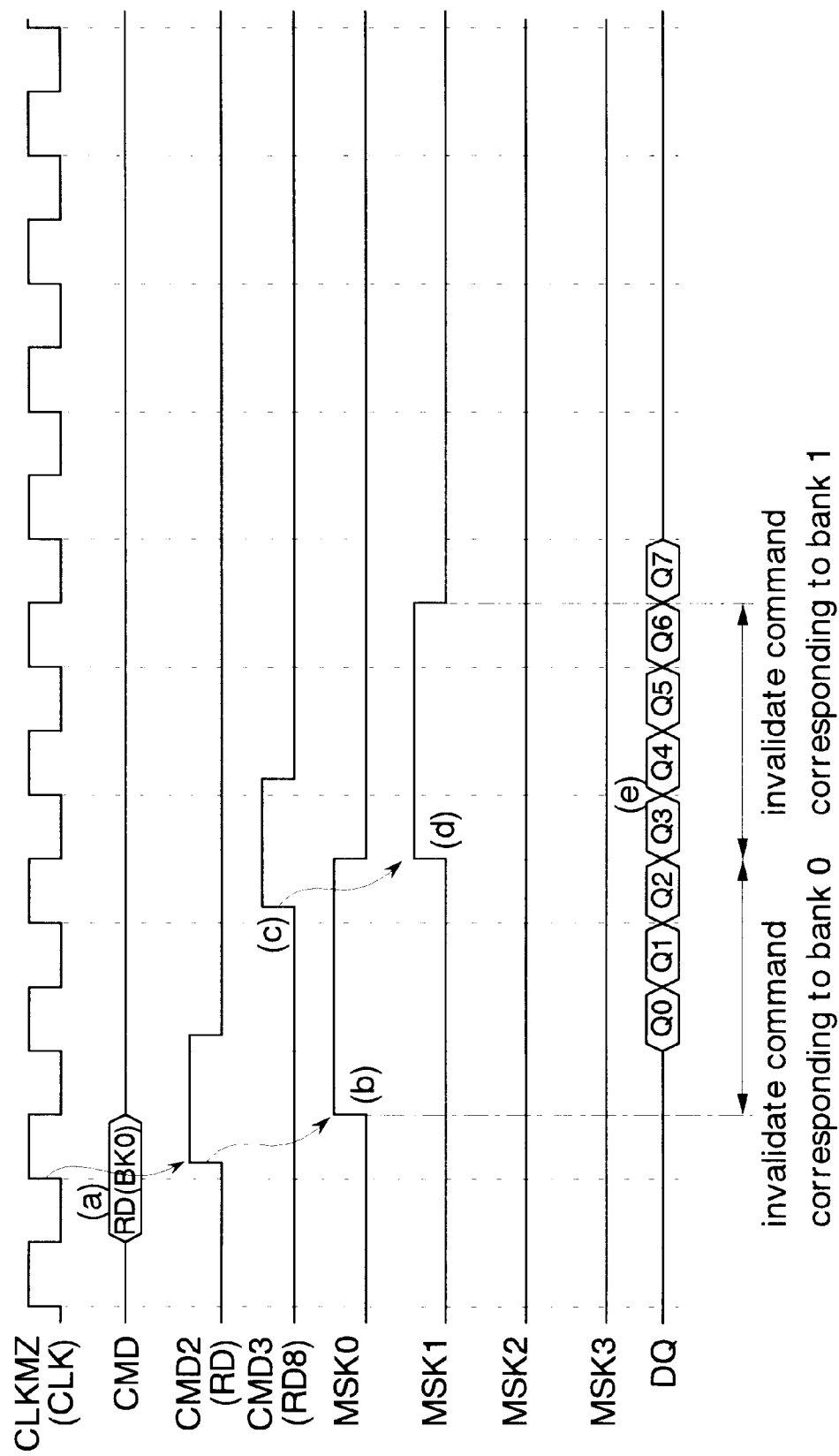
FIG. 12 is a timing chart showing the details of operation of the mask circuit in the second embodiment.

FIG. 12 shows a read operation of the SDRAM when the burst length is "8".

Initially, as in FIG. 11, the SDRAM latches the CMD signal (read command RD) and the BAD signal (BK0) in synchronization with a rise of the CLK signal (FIG. 12, (a)). The mask circuit 58 sets the MSK0 signal, corresponding to the bank BK0, at high level for a period of approximately two clocks (FIG. 12, (b)). During this period, any new command to the bank BK0 is invalidated. The internal command generator 62 shown in FIG. 9 receives the command control signal from the command decoder 56, and activates (turns to high level) the CMD3 signal (read command RD8) in synchronization with the second rise of the CLKMZ signal after the latch of the read command RD (FIG. 12, (c)). The mask circuit 58 receives the CMD3 signal to set the MSK1 signal corresponding to the bank BK1 at high level for a period of approximately two clocks (FIG. 12, (d)). During this period, any new command to the bank BK1 is invalidated. The control circuit 60 in the bank BK0 receives the CMD2 signal and the MSK0 signal, and controls the memory core 24 for read operation. Subsequently, the control circuit 60 in the bank BK1 receives the CMD3 signal and the MSK1 signal, and controls the memory core 24 for read operation. Consequently, in accordance with the burst length, read data Q0, Q1, Q2, and Q3 from the bank BK0 and read data Q4, Q5, Q6, and Q7 from the bank BK1 are output in succession from the data input/output terminal DQ. That is, an interleaving operation is performed over a plurality of banks with consecutive addresses.

The semiconductor integrated circuit in this embodiment can offer the same effects as those obtained from the first embodiment described above. Moreover, in this embodiment, the mask circuit 58 receives the command control signal CMD2 from the command decoder 56 and the command control signal CMD3 from the internal command generator 62 to be used in interleaving operations, and successively activates the mask signals MSKn for address-consecutive banks BKn. Therefore, even in the semiconductor integrated circuit having the interleaving function, the mask circuit 58 can make decisions as to illegal commands so that malfunctions resulting from the illegal commands are prevented with facility and reliability.

The first embodiment described above has dealt with the case where the present invention is applied to an SDRAM having four banks BK0-BK3. The present invention is not limited thereto, and may be applied to SDRAMs having no banks.

The first embodiment described above has dealt with the case where the present invention is applied to an SDRAM which operates in synchronization with the CLK signal. The present invention is not limited thereto, and may be applied to clock asynchronous DRAMs.

The invention is not limited to the above embodiments and various modifications may be made without departing from the spirit and the scope of the invention. Any improvement may be made in part or all of the components.

What is claimed is:

1. A semiconductor integrated circuit comprising:
    a memory core having a plurality of memory cells;
    a command decoder for decoding a command signal to generate a command control signal;
    a mask circuit for receiving said command control signal to determine an operating state of said memory core and activating a mask signal when said command signal is unacceptable; and
    a control circuit for disabling an operation of said memory core corresponding to said command control signal when said mask signal is activated.

2. A semiconductor integrated circuit according to claim 1, wherein said control circuit comprises an input circuit for receiving said command control signal and said mask signal and disabling acceptance of said command control signal when said mask signal is activated.

3. A semiconductor integrated circuit according to claim 2, wherein said control circuit and said memory core individually operate in synchronization with a clock signal; and
    said mask circuit activates said mask signal based on the number of clocks in said clock signal.

4. A semiconductor integrated circuit according to claim 1, comprising a plurality of banks each having said memory core and said control circuit, and wherein
    said mask circuit receives said command control signal and a bank selecting signal to recognize an operating state of said memory core in each of said plurality of banks and respectively generates said mask signal corresponding to each of said control circuits.

5. A semiconductor integrated circuit according to claim 4, having an interleaving function of performing one of a read operation and a write operation in sequence on said plurality of banks with consecutive addresses, when a burst length, representing the number of times said read or write operation is performed in sequence, is greater than a predetermined value.

* * * * *